United States Patent
Hyun

(10) Patent No.: US 8,143,160 B2
(45) Date of Patent: Mar. 27, 2012

(54) METHOD OF FORMING A CONTACT PLUG OF A SEMICONDUCTOR DEVICE

(75) Inventor: Chan Sun Hyun, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 419 days.

(21) Appl. No.: 12/163,950

(22) Filed: Jun. 27, 2008

(65) Prior Publication Data
US 2009/0068834 A1 Mar. 12, 2009

(30) Foreign Application Priority Data
Sep. 6, 2007 (KR) .......... 10-2007-0090299

(51) Int. Cl.
*H01L 21/44* (2006.01)
(52) U.S. Cl. . 438/675; 438/637; 438/639; 257/E21.577; 257/E21.586
(58) Field of Classification Search .......... 438/675, 438/639; 257/E21.577, E21.586
See application file for complete search history.

(56) References Cited

U.S. PATENT DOCUMENTS

| | | | | |
|---|---|---|---|---|
| 6,537,918 B2 * | 3/2003 | Ionov et al. | ............... | 438/710 |
| 2005/0059207 A1 * | 3/2005 | Chang et al. | ............... | 438/249 |
| 2005/0266634 A1 * | 12/2005 | Park et al. | ............... | 438/238 |
| 2007/0034929 A1 * | 2/2007 | Hwang et al. | ............... | 257/314 |
| 2007/0037398 A1 * | 2/2007 | Kim et al. | ............... | 438/720 |

FOREIGN PATENT DOCUMENTS

| KR | 1019990087996 A | 12/1999 |
|---|---|---|
| KR | 1020010058448 A | 7/2001 |
| KR | 1020060077125 A | 7/2006 |

OTHER PUBLICATIONS

Machine Translation of KR-1020060077125.*

* cited by examiner

*Primary Examiner* — Julia Slutsker
(74) *Attorney, Agent, or Firm* — Kilpatrick Townsend & Stockton LLP

(57) ABSTRACT

In a method of forming a contact plug of a semiconductor device, a nitride layer is prevented from being broken by forming a passivation layer over the nitride layer when contact holes are formed by etching an insulating layer between select lines formed over a semiconductor substrate. In an etch process of forming the contact plug, the passivation layer formed on sidewalls of the select lines is formed twice to protect the sidewalls of the select lines. Accordingly, the sidewalls of the select lines can be prevented from being damaged. Consequently, a process margin necessary to form a contact plug can be increased and, therefore, a smaller contact plug can be formed.

13 Claims, 5 Drawing Sheets

METHOD OF FORMING A CONTACT PLUG OF A SEMICONDUCTOR DEVICE

CROSS-REFERENCES TO RELATED APPLICATIONS

The present application claims priority to Korean patent application number 10-2007-0090299, filed on Sep. 6, 2007, which is incorporated by reference in its entirety.

BACKGROUND OF THE INVENTION

The present invention relates to a method of forming a contact plug of a semiconductor device and, more particularly, to a method of forming a contact plug of a semiconductor device, which forms source/drain contact plugs of a NAND flash memory.

Generally, semiconductor memory devices can be classified into volatile memory devices and non-volatile memory devices. Volatile memory devices, such as Dynamic Random Access Memory (DRAM) and Static Random Access Memory (SRAM), exhibit high speed data input/output characteristics, but stored data is lost when power is turned off. Non-volatile memory devices retain their data even when power is turned off.

A flash memory device is a high-integrated non-volatile memory device. The flash memory device was developed by taking advantage of Erasable Programmable Read Only Memory (EPROM) that can be programmed and erased and Electrically Erasable Programmable Read Only Memory (EEPROM) that can be electrically programmed and erased. Here, the term 'program' refers to an operation of writing data into a memory cell, and the term 'erase' refers to an operation of deleting data written into a memory cell.

The flash memory device may be categorized as NOR type or NAND type flash memory devices according to the structure and operating condition of a cell. In the NOR type flash memory device, the drain of each memory cell transistor is coupled to a bit line, enabling program and erase with respect to a specific address and, therefore, increasing operating speed. The NOR type flash memory device is generally used in applications requiring a high-speed operation. In contrast, in the NAND type flash memory device, a plurality of memory cell transistors is connected in series, constituting one string, and one string is coupled between bit lines and a common source line. Thus, the NAND type flash memory device has a relatively small number of drain contact plugs, facilitating high integration. Accordingly, the NAND type flash memory device is generally used in applications requiring high-capacity data retention.

The NAND type flash memory device includes a plurality of word lines formed between a source select line and a drain select line. A select line, for example, the source select line or the drain select line, is formed by connecting gates of select transistors, each included in a plurality of strings. The word lines are formed by connecting gates of memory cell transistors. The select line and the word line include a tunnel oxide layer, a floating gate, a dielectric layer and a control gate. In the select line, the floating gate and the control gate are electrically connected. A junction is formed between each select line and each word line. The junction between the source select lines is a source area, and the junction between the drain select lines is a drain area.

A spacer and a nitride layer are formed on the sides of the select lines and the word lines. An insulating layer is formed on the entire surface of the select lines and the word lines. A contact hole, through which the junction between the select lines is exposed, is formed in the insulating layer. The contact hole is gap-filled with conductive material, thereby forming a contact plug electrically connected to the junction.

FIG. 2 is a photograph showing defects on the sidewalls of a select line in a conventional process of forming contact holes.

The nitride layer can protect the sides of the select lines to some extent when the contact holes are misaligned. However, when the contact holes are greatly misaligned, much of the nitride layer is lost, which may cause the nitride layer to break. Accordingly, the sidewalls of the spacer and the select lines formed under the nitride layer may be lost and broken (refer to 'C'). Consequently, the select lines and the contact plug are directly interconnected, resulting in failure of the memory device.

BRIEF SUMMARY OF THE INVENTION

The present invention prevents a nitride layer from being broken by forming a passivation layer over the nitride layer when contact holes are formed by etching an insulating layer between select lines formed over a semiconductor substrate.

According to an aspect of the present invention, a method of forming a contact plug of a semiconductor device is provided. According to this method, a plurality of select lines and a plurality of word lines are formed over a semiconductor substrate. Junctions are formed in the semiconductor substrate exposed between the select lines and the word lines. A first passivation layer is formed over the select lines and the word lines. An insulating layer is formed on the first passivation layer. A contact hole is formed in the insulating layer between the select lines such that the first passivation layer between the select lines is exposed. A second passivation layer is formed on the first passivation layer that is exposed on sidewalls of the contact hole. The first passivation layer at a bottom surface of the contact hole is removed. Conductive material is formed within the contact hole, thereby forming a contact plug that is connected to the junction.

The second passivation layer may be formed from material having an etch selectivity that is different from that of the first passivation layer. The second passivation layer may be formed of a high-k material. The second passivation layer may include $HfO_2$, $Al_2O_3$, or $ZrO_2$. The second passivation layer may be formed to a thickness of 100 to 300 angstroms. The formation of the second passivation layer may include forming the second passivation layer over the insulating layer including the contact hole, and performing an etch process such that the second passivation layer remains only on the sidewalls of the contact hole. The etch process may be performed using $BCl_3$ gas. Before the contact plug is formed, the second passivation layer may be removed. The second passivation layer may be removed using an etchant. The etchant may include a BOE solution or a HF solution. The first passivation layer may be formed of a nitride layer. Before the first passivation layer is formed, a spacer may be formed on the sidewalls of the select lines. Before the first passivation layer is formed, a buffer layer may be formed over the select lines and the word lines. The buffer layer may be formed of an oxide layer.

According to an aspect of the present invention, a method of forming a contact plug of a semiconductor device is provided. According to this method, a plurality of gates is formed over a semiconductor substrate. Junctions are formed in the semiconductor substrate exposed between the gates. A first passivation layer is formed over the gates. An insulating layer is formed on the first passivation layer. A contact hole is formed in the insulating layer between the gates such that the first passivation layer between the gates is exposed. A second passivation layer is formed on the first passivation layer that is exposed on sidewalls of the contact hole. The first passivation layer at a bottom surface of the contact hole is removed. Conductive material is formed within the contact hole, thereby forming a contact plug that is connected to the junction.

DETAILED DESCRIPTION

Specific embodiments according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

FIGS. 1A to 1I are cross-sectional views illustrating a method of forming a contact plug of a semiconductor device in accordance with an embodiment of the present invention.

Figure 1A:
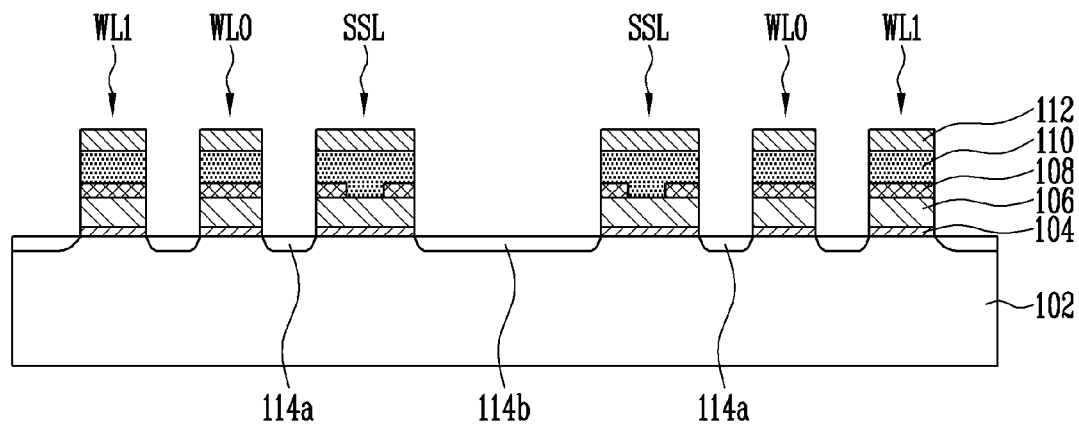
FIGS. 1A to 1I are cross-sectional views illustrating a method of forming a contact plug of a semiconductor device in accordance with embodiments of the present invention.

Referring to FIG. 1A, isolation regions (not shown) and active regions are defined in a semiconductor substrate 102 for forming semiconductor devices, in particular, flash memory devices. The isolation and active regions are formed through a well formation process, a threshold voltage control process, an isolation layer formation process, and so on. Stacked layers, each including a tunnel dielectric layer 104, a first conductive layer 106 for a floating gate, a dielectric layer 108, a second conductive layer 110 for a control gate, and a gate electrode layer 112, are formed over the semiconductor substrate 102. The first conductive layer 106 and the second conductive layer 110 may be formed from polysilicon, and the dielectric layer 108 may have an oxide/nitride/oxide (ONO) structure. A capping poly layer (not shown) for protecting the dielectric layer 108 may be further formed on the dielectric layer 108. The dielectric layer 108 of the select transistor area may be partially etched to electrically connect the first conductive layer 106 and the second conductive layer 110. The gate electrode layer 112 may be formed from tungsten silicide (WSix).

The stacked layers are patterned using an etch process employing a gate mask pattern (not shown) formed on the gate electrode layer 112. Accordingly, word lines WL0, WL1, . . . , in which a plurality of memory cell gates is connected in series, are formed in the active region of the semiconductor substrate 102. Each of the memory cell gates has the stacked structure of the tunnel dielectric layer 104, the first conductive layer 106 for the floating gate, the dielectric layer 108, the second conductive layer 110 for the control gate, and the gate electrode layer 112. Typically, the number of word lines WL0, WL1, . . . is 16 or 32. However, it is to be understood that only two word lines are illustrated for convenience sake. Select lines, to which a number of select transistors are connected in series, are formed across the word lines WL0, WL1, . . . . Each of the select transistors has the stacked structure of the tunnel dielectric layer 104, the first conductive layer 106 and the second conductive layer 110, which are electrically connected to each other, and the gate electrode layer 112. Although the select lines include a source select line SSL and a drain select line DSL, only the source select lines SSL are illustrated for convenience sake.

A number of junctions 114a, 114b are formed by performing an ion implantation process on the semiconductor substrate 102 exposed between the word lines and the source select lines SSL. The junction 114b formed between the source select lines SSL becomes a source area. Although not shown in the drawings, the junctions formed between the drain select lines DSL become drain areas.

Figure 1B:
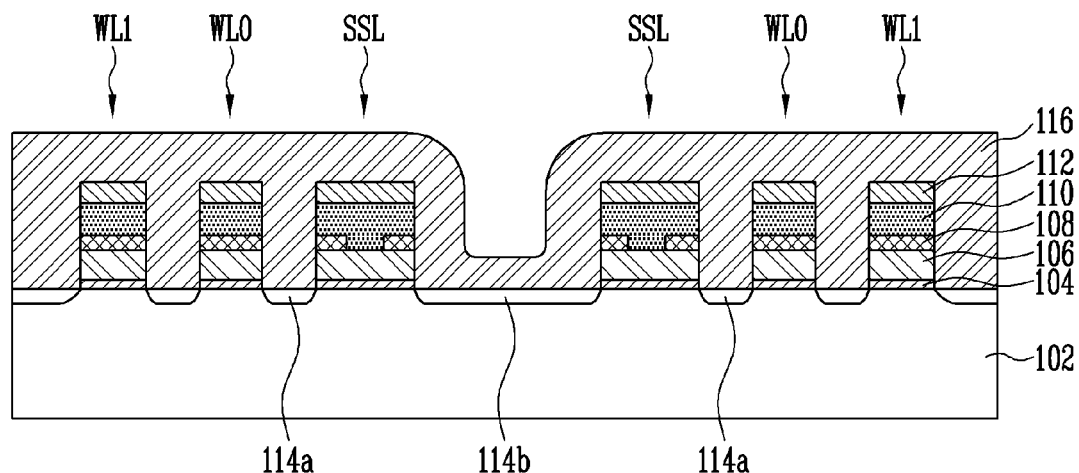

Referring to FIG. 1B, a first insulating layer 116 is formed over the semiconductor substrate 102, including the word lines and the select lines. The first insulating layer 116 gap-fills the spaces between the word lines and the select lines, and may be formed to a thickness sufficient to surround the sidewalls of the select lines. The first insulating layer 116 may be an oxide layer or a nitride layer.

Figure 1C:
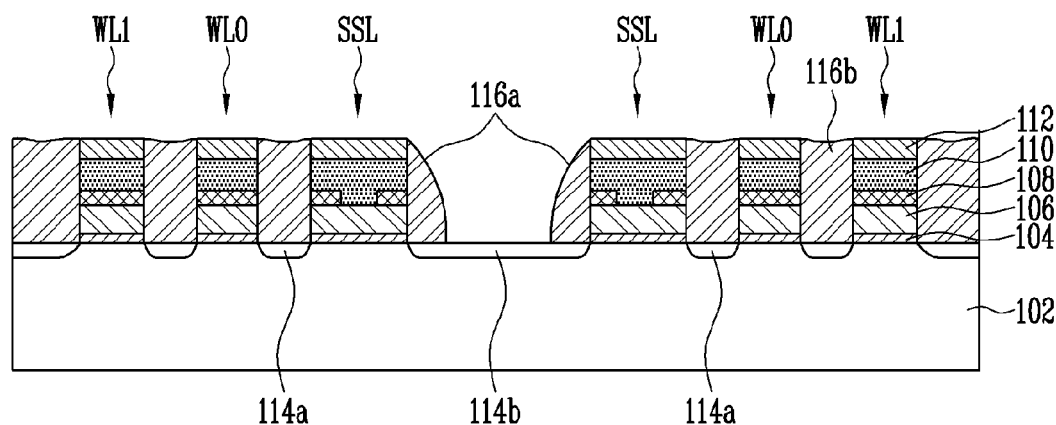

Referring to FIG. 1C, an anisotropic etch process is performed on the first insulating layer (refer to 116 of FIG. 1B). Thus, a spacer 116a is formed on the sidewalls of the source select lines and the drain select lines (not shown). The spacer 116a has a width that gradually widens downwardly and, therefore, has a rounded shape. A gap between the word lines and a gap between the select line and the word line are narrower than a gap between the select lines. Thus, the first insulating layer 116b remains in the gaps, and the junction 114b formed in the semiconductor substrate 102 between the source select lines SSL is exposed.

Figure 1D:
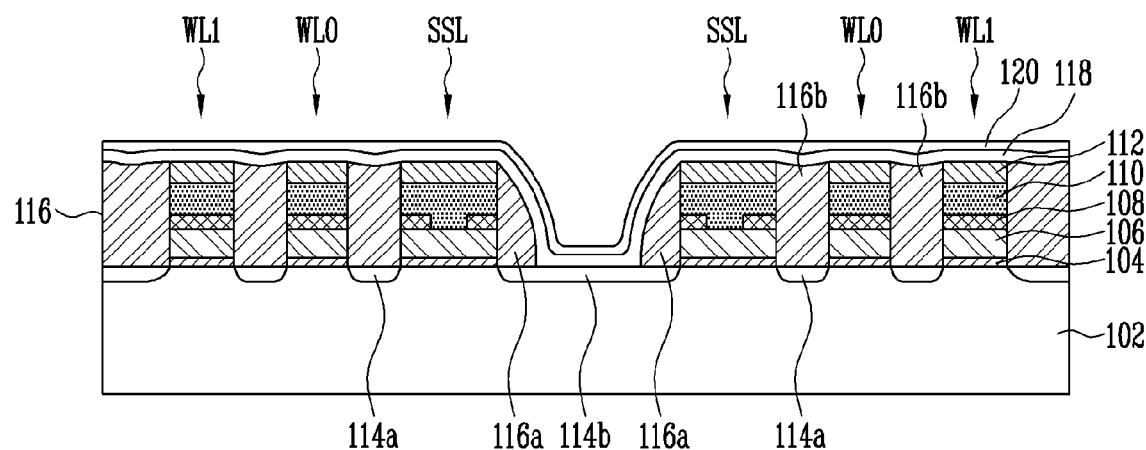

Referring to FIG. 1D, a buffer layer 118 and a first passivation layer 120 are formed over the surface of the semiconductor substrate 102, including the first insulating layer 116. The buffer layer 118 functions to minimize stress of the passivation layer 120 and may be formed to a thickness of about 100 angstroms. The first passivation layer 120 may be formed to a thickness sufficient to maintain the step of the stacked layers. The first passivation layer 120 functions to protect the sidewalls of the select lines, and may be formed using a self-aligned contact (SAC) process for preventing the sidewalls of the select lines from being etched and damaged even if an alignment error occurs when a contact hole is formed on the junction 114b in a subsequent process. The first passivation layer 120 may be an insulating layer, for example, a nitride layer.

Figure 1E:
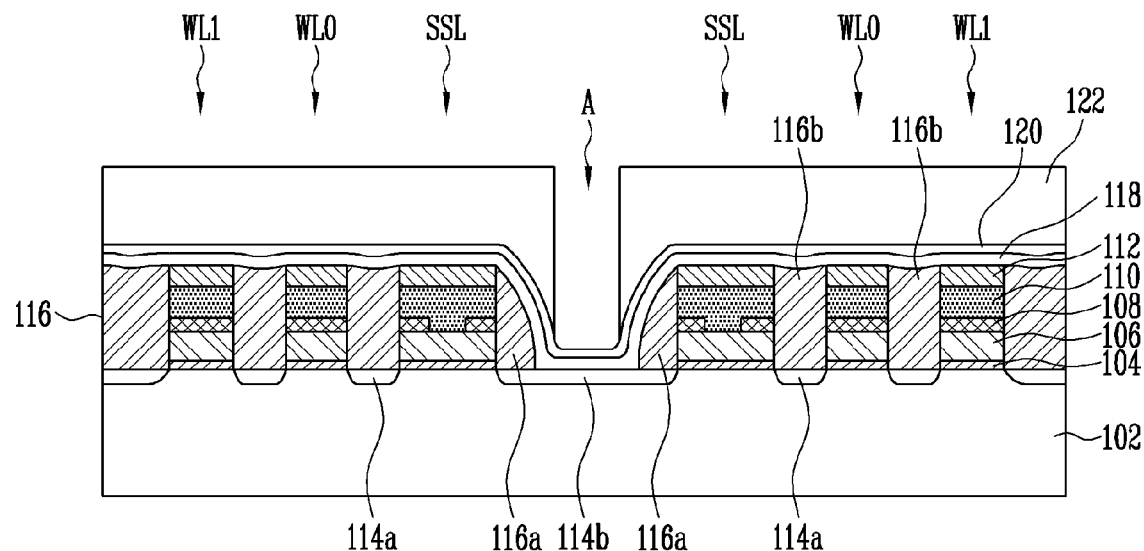

Referring to FIG. 1E, a second insulating layer 122 is formed over the semiconductor substrate 102 including the first passivation layer 120. The second insulating layer 122 is formed to a thickness sufficient to gap-fill the spaces between the select lines, and may be formed of an oxide layer. A contact hole A is formed by performing a SAC process to etch the second insulating layer 122 between the select lines until the first passivation layer 120 is exposed. The SAC etch process may be performed using a mixture gas of $C_5F_8$ gas and $CH_2F_2$ gas.

Figure 1F:
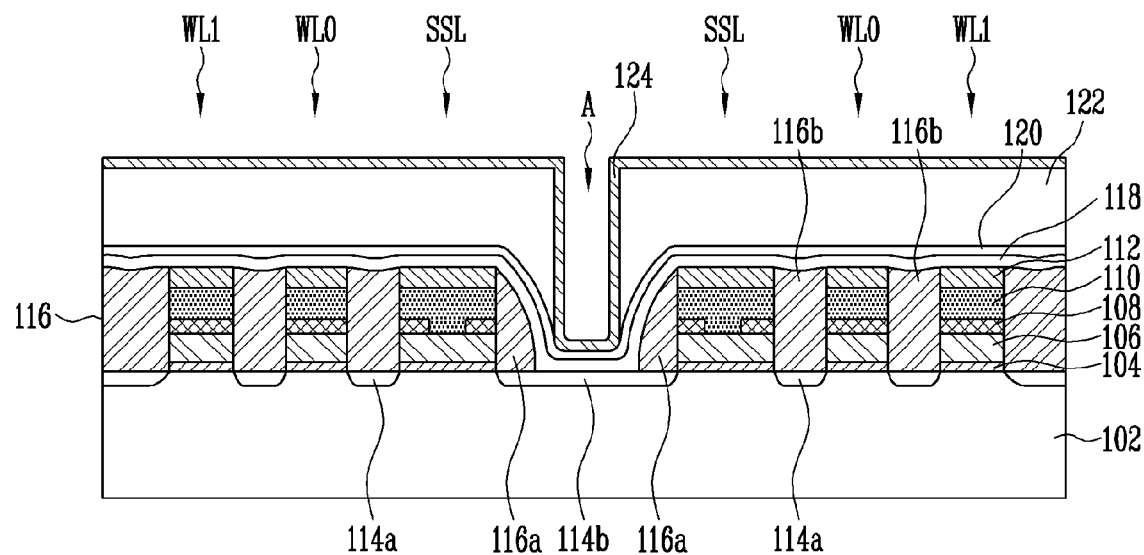

Referring to FIG. 1F, a second passivation layer 124 is formed on the second insulating layer 122 including the contact hole A. The second passivation layer 124 may prevent the first passivation layer 120, which is exposed due to the formation of the contact hole A, from being damaged in a subsequent etch process. Accordingly, the second passivation layer 124 may be formed of materials having an etch selectivity that is different from that of the first passivation layer 120.

For example, the second passivation layer 124 may be formed of a high-k material. The high-k material may include $HfO_2$, $Al_2O_3$, $ZrO_2$ or the like. The second passivation layer 124 may be formed to a thickness which maintains the shape of the contact hole A, for example, 100 to 300 angstroms.

Figure 1G:
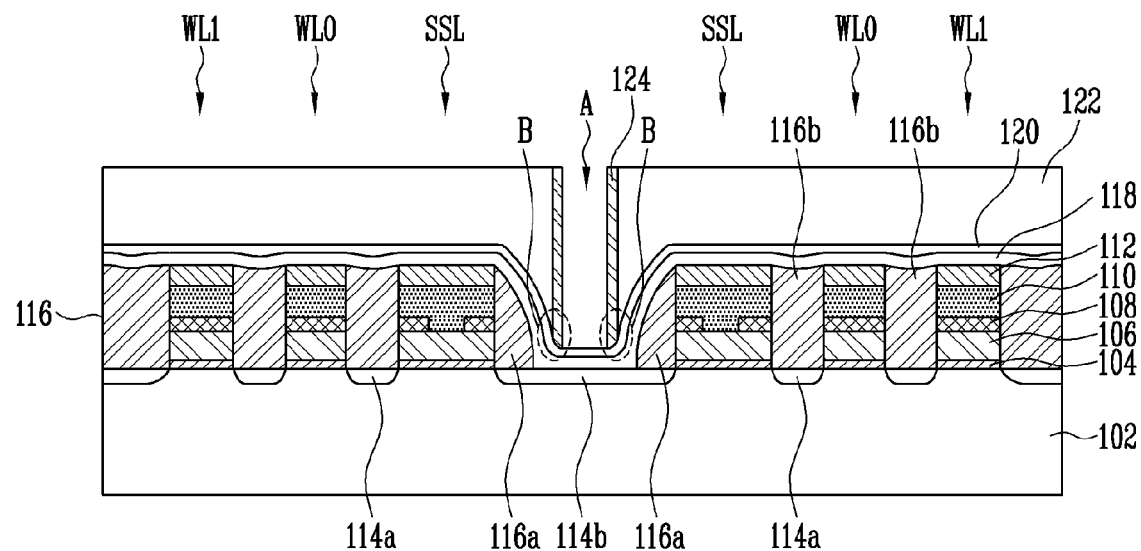

Referring to FIG. 1G, an anisotropic etch process of selectively etching only the second passivation layer 124 is carried out, such that the second passivation layer 124 remains only on the sidewalls of the contact hole A. The second passivation layer 124 is removed from a bottom surface of the contact hole A, thereby exposing the first passivation layer 120. The etch process may employ $BCl_3$ gas. Therefore, the first passivation layer 120 formed near lower portions B of the contact hole A is protected by the second passivation layer 124.

Figure 1H:
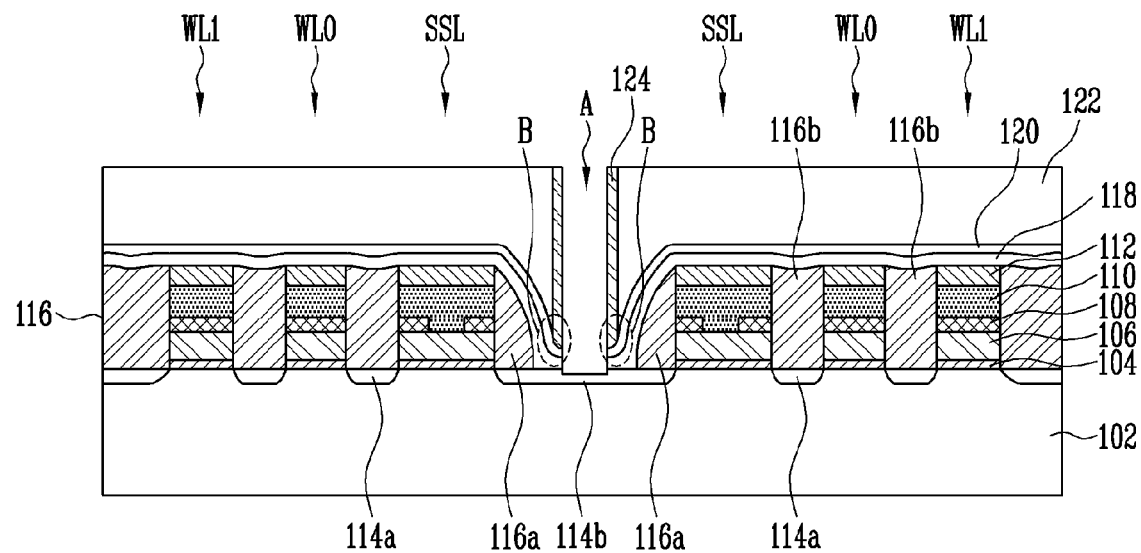

Referring to FIG. 1H, the first passivation layer 120 exposed at the bottom surface of the contact hole A is removed. The first passivation layer 120 formed near the lower portions B of the contact hole A is protected by the second passivation layer 124 and, therefore, is not further etched and damaged. The first passivation layer 120 may be removed by an etch process employing a mixture gas of $CHF_3$ gas and Ar gas. The etch process of the first passivation layer 120 may be carried out in-situ or ex-situ along with the above etch process of the second passivation layer 124.

Figure 1I:
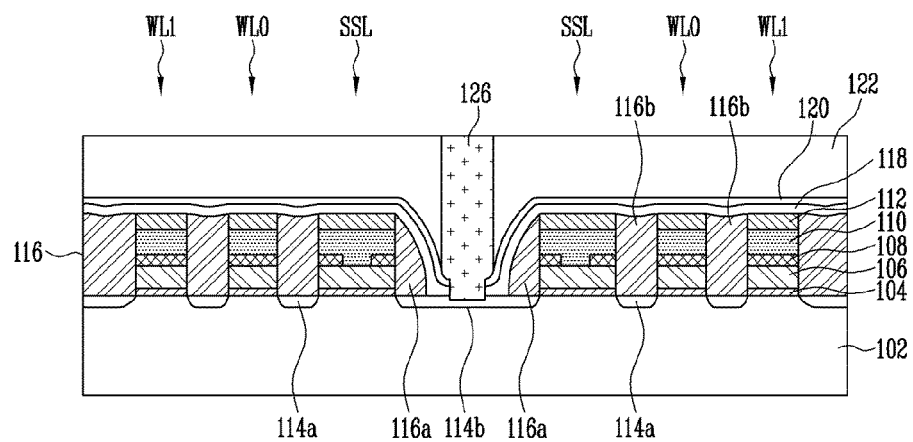
Figure 2:
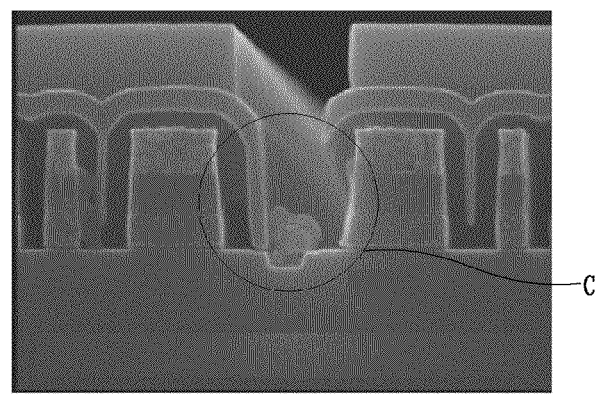
FIG. 2 is a photograph showing defects on sidewalls of a select line in a conventional process of forming contact holes.

Referring to FIG. 1I, a cleaning process employing an etchant is performed to remove the second passivation layer (refer to 124 of FIG. 1H). The etchant may include a BOE solution or a HF solution. The contact hole (refer to A of FIG. 1H) is gap-filled with conductive material, for example, tungsten (W), thereby forming a contact plug 126. In accordance with embodiments of the present invention, the second passivation layer (refer to 124 of FIG. 1H) is removed and the contact plug 124 is then formed. However, the contact plug 124 may be formed without removing the second passivation layer (refer to 124 of FIG. 1H).

Embodiments of the present invention have been described using the contact plug formation method of a flash memory device as an example. However, the present invention is not so limited. For example, it is to be understood that the present invention may be applied to the manufacturing process of all semiconductor devices, for forming a contact plug electrically connected to a junction between gates, by substituting the select line with the gate. Even in this case, a passivation layer formed on sidewalls of the gate may be formed twice in an etch process of forming the contact plug to further protect the sidewalls of the gate. Accordingly, there is an advantage in that the sidewalls of the gate are protected.

According to the method of forming a contact plug of a semiconductor device in accordance with embodiments of the present invention, in an etch process of forming the contact plug, a passivation layer formed on the sidewalls of select lines is formed twice to protect the sidewalls of the select lines. Accordingly, the sidewalls of the select lines can be prevented from being damaged. Consequently, a process margin necessary to form a contact plug can be increased and, therefore, a smaller contact plug can be formed.

The embodiments disclosed herein have been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of forming a contact plug of a semiconductor device, the method comprising:
    forming select lines and word lines over a semiconductor substrate;
    forming junctions in the semiconductor substrate exposed between the select lines and between the word lines;
    forming a nitride layer along sidewalls of the select lines and the semiconductor substrate between the select lines;
    forming an insulating layer over the nitride layer to fill a region between the select lines;
    etching the insulating layer to expose the nitride layer between the select lines thereby forming a contact hole;
    forming a high-k layer along the insulating layer including the contact hole, wherein an etch selectivity of the high-k layer is different from that of the nitride layer;
    performing an anisotropic etch process to selectively etch the high-k layer such that the high-k layer remains on sidewalls of the contact hole, wherein the nitride layer between the select lines and a top surface of the insulating layer are exposed;
    removing the nitride layer between the select lines to expose the junction between the select lines under a condition that the nitride layer on the sidewalls of the select lines is protected by the high-k layer on the sidewalls of the contact hole;
    removing the high-k layer on the sidewalls of the contact hole to expose sidewalls of the insulating layer through the contact hole; and
    forming conductive material within the contact hole, thereby forming a contact plug connected to the junction between the select lines in the contact hole.

2. The method of claim 1, wherein the high-k layer comprises any one of $HfO_2$, $Al_2O_3$, and $ZrO_2$.

3. The method of claim 1, wherein the high-k layer is formed to a thickness of 100 to 300 angstroms.

4. The method of claim 1, wherein the anisotropic etch process is performed using $BCl_3$ gas.

5. The method of claim 1, wherein the high-k layer is removed using an etchant.

6. The method of claim 5, wherein the etchant comprises a BOE solution or a HF solution.

7. The method of claim 1, further comprising, before the nitride layer is formed, forming a spacer on sidewalls of the select lines.

8. The method of claim 1, further comprising, before the nitride layer is formed, forming a buffer layer over the select lines and the word lines.

9. The method of claim 8, wherein the buffer layer comprises an oxide layer.

10. A method of forming a contact plug of a semiconductor device, the method comprising:
    forming gates over a semiconductor substrate;
    forming a junction in the semiconductor substrate exposed between the gates;
    forming a nitride layer over sidewalls of the gates and over the semiconductor substrate exposed between the gates;
    forming an insulating layer to fill a region between the gates;
    etching the insulating layer to expose the nitride layer between the gates thereby forming a contact hole;
    forming a high-k layer along the insulating layer including the contact hole, wherein an etch selectivity of the high-k layer is different from that of the nitride layer;
    performing an anisotropic etch process to selectively etch the high-k layer such that the high-k layer remains on sidewalls of the contact hole, wherein the nitride layer between the gates and a top surface of the insulating layer are exposed;
    removing the nitride layer between the gates to expose the junction between the gates under a condition that the nitride layer on the sidewalls of the gates is protected by the high-k layer on the sidewalls of the contact hole;

removing the high-k layer on the sidewalls of the contact hole to expose sidewalls of the insulating layer through the contact hole; and forming conductive material within the contact hole, thereby forming a contact plug connected to the junction between the gates in the contact hole.

11. A method of forming a contact plug of a semiconductor device, the method comprising:

forming select lines and word lines over a semiconductor substrate, wherein a distance between the select lines is greater than a distance between the word lines;

forming junctions in the semiconductor substrate exposed between the select lines and between the word lines;

forming a spacer on sidewalls of the select lines and the word lines to fill a region between the word lines and to expose the semiconductor substrate between the select lines;

forming a nitride layer along surfaces of the select lines, the spacers and the word lines;

forming an insulating layer to fill a region between the select lines;

etching the insulating layer to expose the nitride layer between the select lines thereby forming a contact hole;

forming a high-k layer along the insulating layer including the contact hole, wherein an etch selectivity of the high-k layer is different from that of the nitride layer;

performing an anisotropic etch process to selectively etch the high-k layer such that the high-k layer remains on sidewalls of the contact hole, wherein the nitride layer between the select lines and a top surface of the insulating layer are exposed;

removing the nitride layer between the select lines to expose the junction between the select lines under a condition that the nitride layer on the sidewalls of the select lines is protected by the high-k layer on the sidewalls of the contact hole;

removing the high-k layer on the sidewalls of the contact hole to expose sidewalls of the insulating layer through the contact hole; and forming a contact plug in the contact hole, wherein the contact plug is connected to the junction formed between the select lines.

12. The method of claim 11, wherein the high-k layer is formed to a thickness of 100 to 300 angstroms.

13. The method of claim 11, further comprising, before the nitride layer is formed, forming a buffer layer over the select lines and the word lines.

\* \* \* \* \*